United States Patent [19]

Murakami et al.

[11] Patent Number: 4,691,225

[45] Date of Patent: Sep. 1, 1987

[54] SEMICONDUCTOR DEVICE AND A METHOD OF PRODUCING THE SAME

[75] Inventors: Gen Murakami, Machida; Takeshi Gappa, Ohme, both of Japan

[73] Assignee: Hitachi, Ltd., Tokyo, Japan

[21] Appl. No.: 462,060

[22] Filed: Jan. 28, 1983

[30] Foreign Application Priority Data

Feb. 5, 1982 [JP] Japan ............................ 57-16230
Feb. 5, 1982 [JP] Japan ............................ 57-16231

[51] Int. Cl.[4] ............................................ H01L 39/02
[52] U.S. Cl. .............................. 357/80; 174/52 FP; 357/74; 357/81
[58] Field of Search .......... 174/52 FP, 52 PE, 68.5; 361/386, 401; 357/73, 74, 80, 81

[56] References Cited

U.S. PATENT DOCUMENTS

| | | | |
|---|---|---|---|
| 3,778,685 | 12/1973 | Kennedy | 357/73 |
| 3,916,434 | 10/1975 | Garboushian | 357/80 |
| 3,936,866 | 2/1976 | Grossman et al. | 357/80 |
| 4,079,511 | 3/1978 | Grabbe | 357/74 |
| 4,190,855 | 2/1980 | Inoue | 357/80 |
| 4,218,701 | 8/1980 | Shirasaki | 357/80 |
| 4,246,595 | 1/1981 | Noyori et al. | 357/70 |
| 4,280,132 | 7/1981 | Hayakawa et al. | 357/80 |
| 4,288,841 | 9/1981 | Gogal | 174/52 FP |
| 4,300,153 | 11/1981 | Hayakawa et al. | 357/80 |
| 4,366,342 | 12/1982 | Breedlove | 174/52 FP |
| 4,459,607 | 7/1984 | Reid | 357/80 |
| 4,463,217 | 7/1984 | Orcutt | 174/52 FP |
| 4,477,827 | 10/1984 | Walker et al. | 357/70 |
| 4,495,376 | 1/1985 | Hightower et al. | 174/52 FP |
| 4,496,965 | 1/1985 | Orcutt et al. | 357/70 |

FOREIGN PATENT DOCUMENTS

| | | |
|---|---|---|
| 35093 | 1/1981 | European Pat. Off. . |
| 58068 | 8/1982 | European Pat. Off. . |
| 2382101 | 10/1978 | France ................... 357/80 |
| 2498814 | 7/1982 | France . |
| 58468 | 5/1977 | Japan ..................... 357/80 |
| 1339660 | 12/1973 | United Kingdom . |
| 1463023 | 2/1977 | United Kingdom . |
| 1523225 | 8/1978 | United Kingdom . |
| 1531677 | 11/1978 | United Kingdom ......... 357/80 |

Primary Examiner—William L. Sikes
Assistant Examiner—Frank González
Attorney, Agent, or Firm—Antonelli, Terry & Wands

[57] ABSTRACT

A semiconductor device comprising a package base whose material is glass epoxy or the like, a plurality of leads which are formed in a manner to extend from the front surface to the rear surface of the package base, a semiconductor element which is fastened to the package base and which is electrically connected to the leads, and a resin which seals, at least, the semiconductor element and electrical connection parts between the element and the leads.

33 Claims, 17 Drawing Figures

SEMICONDUCTOR DEVICE AND A METHOD OF PRODUCING THE SAME

BACKGROUND OF THE INVENTION

The present invention relates to semiconductor devices of the carrier package type. More particularly, it relates to a semiconductor device which has its package thinned and its cost lowered and which is made easy of installation, and also to a method of producing the same.

In general, a semiconductor device of the type including a carrier package called a chip carrier can be completely installed merely by placing it directly on a circuit board for installation and connecting the wiring terminals of the circuit board with the external connection terminals of the semiconductor device. Therefore, the semiconductor device of the specified type is effective to facilitate the installing job and to thin the whole apparatus in which the semiconductor device is built, and the demand therefor tends to increase more and more.

Most of the prior art semiconductor devices of this type employ a carrier package of ceramic as shown in FIG. 1. This carrier package 1 is constructed and used as stated below. A recess 3 is formed in the upper surface of a carrier base 2 which is formed by, e.g., the green process of ceramic. A semiconductor element (pellet) 4 is fastened on the inner bottom surface of the recess 3. Leads 6, each of which consists of an inner lead for connection with the pellet and an outer lead for external connection, are formed by such an expedient as metallizing in a manner to extend from the perimeter of the recess 3 to the rear surface of the base. After the pellet 4 and the leads 6 are electrically connected by wires 7, the resultant structure is encapsulated by a cap 8 of metal or ceramic.

With this package, however, since there is a limitation to reduction in the thickness of the green ceramic, reduction in the thickness of the base 2 formed by the lamination thereof is naturally limited, which forms an obstacle to thinning the whole package. Moreover, since the green process referred to above includes many steps, the entire package becomes expensive conjointly with the material cost of the ceramic.

Further, the ceramic is greatly different in the coefficient of thermal expansion from a printed circuit board of a glass epoxy material or the like, which is usually used as a board for installation. Therefore, when the ceramic package is directly secured and connected to the printed circuit board of this type, a stress attributed to the difference of the coefficients of thermal expansion develops between the package and the printed circuit board with a change in temperature, and the connection therebetween is sometimes damaged.

Moreover, such ceramic packages are manufactured individually one by one. It is therefore difficult to perform fully automatically the operations of fastening the pellet 4 onto the base 2, bonding the wires 7, fastening the cap 8, etc. Another disadvantage is that the dimensions of the packages manufactured individually are subject to errors, which render the automation more difficult.

SUMMARY OF THE INVENTION

The first object of the present invention is to provide a semiconductor device which can thin the semiconductor device described above and lower the cost thereof. In addition, the second object is to provide a semiconductor device which facilitates the installation thereof on a printed circuit board used ordinarily and which, on the other hand, can enhance the dimensional accuracy. Further, the third object is to provide a semiconductor device which can achieve the automation of production thereof.

Further, the fourth object of the present invention is to provide a method of producing a semiconductor device which can readily and efficiently produce the semiconductor device described above.

Moreover, the fifth object of the present invention is to provide a multiple frame for providing a plurality of bases for a corresponding plurality of semiconductor devices, said multiple frame being formed from a single elongate substrate, whereby automation of production of the semiconductor devices is facilitated and production efficiency increased.

BRIEF DESCRIPTION OF THE DRAWINGS

FIG. 2(A) is a perspective view, partly in section, of a semiconductor device embodying the present invention, while

FIGS. 3(A)-3(I), FIG. 4 and FIG. 5 are flow diagrams showing a method of producing the semiconductor device shown in FIGS. 2(A) and 2(B), in which FIGS. 3(A), 3(B), 3(D), 3(F), 3(G) and 3(H) are front perspective views, FIG. 3(C) is a sectional view and FIGS. 3(E) and 3(I) are rear perspective views, FIG. 4 is a perspective view of a frame in a multiple state, and FIG. 5 is a sectional view showing the state in which the assemblage is completed.

FIG. 7 is a sectional view of a semiconductor device according to still another embodiment, while

DESCRIPTION OF THE PREFERRED EMBODIMENTS

A semiconductor device according to the present invention and a method of producing the same will be described in conjunction with illustrated embodiments.

Figure 1:
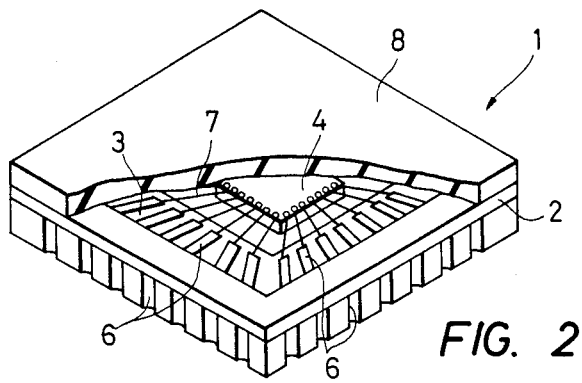
FIG. 1 is a perspective view, partly in section, showing a prior art semiconductor device of the carrier package type.
Figure 2A:
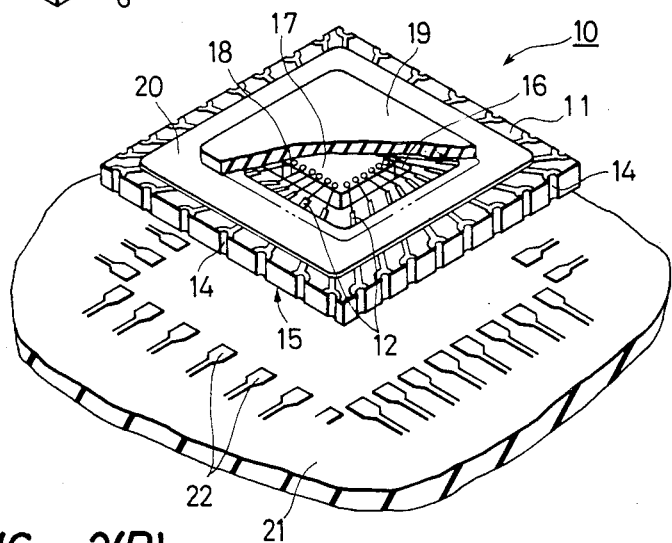
Figure 2B:
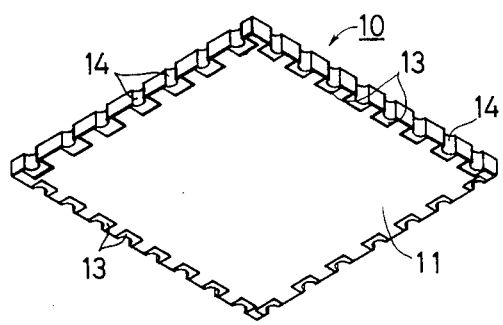
FIG. 2(B) is a rear perspective view of the semiconductor device shown in FIG. 2(A).

FIGS. 2(A) and 2(B) are fragmentary perspective views of a semiconductor device 10 according to the present invention. Referring to the figures, numeral 11 designates a base which is made of a glass epoxy plate (glass fibers filled with an epoxy resin). The base can have a thickness, for example, of about 100-1600 μm. As the glass epoxy plate, one usually used as a printed circuit board can be utilized as it is. Such plate can be prepared, for example, by preparing a thin plate of glass fibers having a thickness, for example, of 600 μm; soaking the plate in a melted thermosetting epoxy resin, to fill the plate with epoxy resin, and then drying the combination thus obtained. Such a plate can, for example, be comprised of 60 wt % glass fiber and 40 wt % epoxy resin. Conductive layers formed on both the surfaces of the circuit board are etched as will be described later, to form inner leads 12 and outer leads 13, and these inner and outer leads are connected by connective portions 14 formed by the conventional through-hole technique, whereby leads 15 are formed. A square recess 16 is formed centrally of the upper surface of the base 11 by cutting or the like, and a semiconductor element (pellet) 17 is fixed on the inner bottom surface of the recess by a binder or the like. For example, the binder can be a resin material such as an epoxy resin or polyimide resin, a low-melting glass, or a gold-silicon eutectic. The electrode pads of the pellet 17 and the aforementioned inner leads 12 are connected by wires 18. Thereafter, the pellet 17, wires 18 and inner leads 12 are covered with a resin 19 supplied onto the base 11 by such a conventional technique as potting, whereby they are encapsulated. Examples of such resin 19 include epoxy resin and silicone resin. In the leads 15, at least the inner leads 12 and the outer leads 13 are plated with gold so as to facilitate soldering at the connection of the wires 18 and the installation of the semiconductor device on the printed circuit board. The exposed parts of the leads (except the wire bonding parts thereof) on the upper surface of the base 11 may well be coated with a resin for protection 20 in advance. Examples of such resins for protection 20 include thermosetting epoxy resins.

As shown in FIG. 2(A), the semiconductor device constructed as above described is placed, with its rear surface facing down, on conductive patterns 22 which are formed on an ordinary printed circuit board 21 made of, e.g., glass epoxy or glass phenol (plate of glass fibers filled with phenol resin). The outer leads 13 are directly connected to the respectively corresponding pattern electrodes 22 by a brazing material such as a solder. Then, the installation is finished.

Now, the method of producing the semiconductor device of the above construction will be described with reference to FIGS. 3(A)–3(I), FIG. 4 and FIG. 5.

Figure 3A:
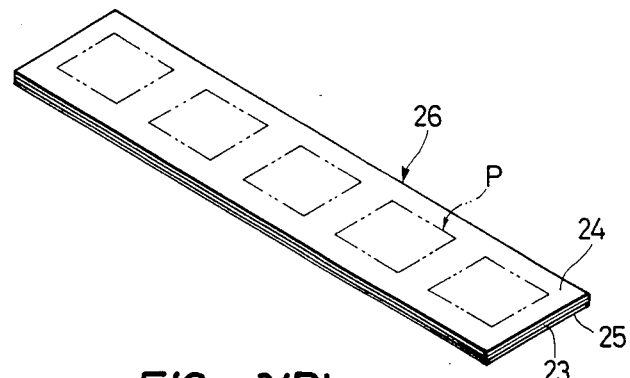

First, as shown in FIG. 3(A), a substrate 26 is prepared in which copper foils 24 and 25 as conductive layers are respectively formed on the front and rear surfaces (upper and lower surfaces) of a glass epoxy plate 23. Such copper foils can be formed on the front and rear surfaces by being bonded thereto by an adhesive, e.g., such as an epoxy resin. Alternatively, the substrate 26 can be formed by positioning the copper foils 24 and 25 on the front and rear surfaces of the glass epoxy plate, and then pressing the foils, e.g., with a pressure of about 100 kg/cm$^2$, while heating at a temperature of 150° C.–250° C. In this case, since a plurality of (five) packages are usually formed in multiple fashion and at the same time, an elongate substrate is used as the substrate 26. In the following, the method of production will be described with stress laid on the single package.

Figure 3B:
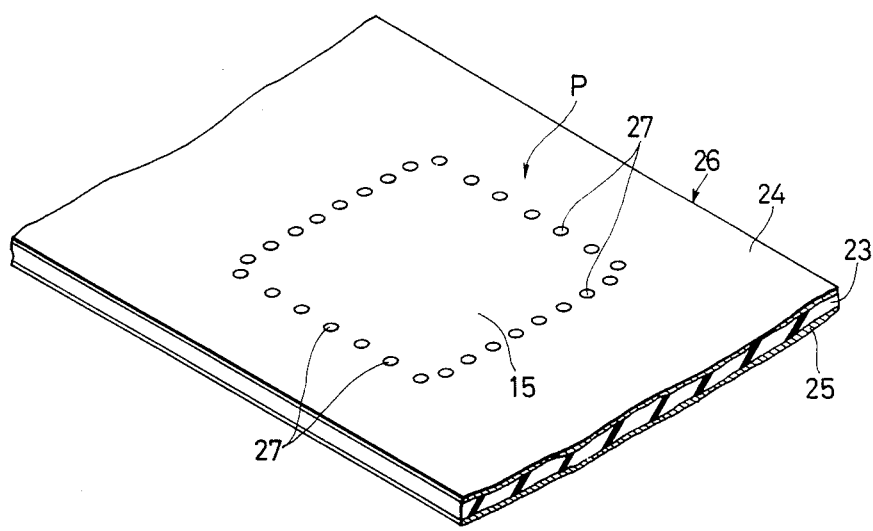
Figure 3C:
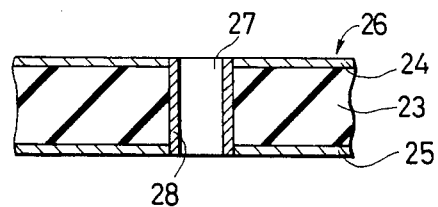
Figure 3D:
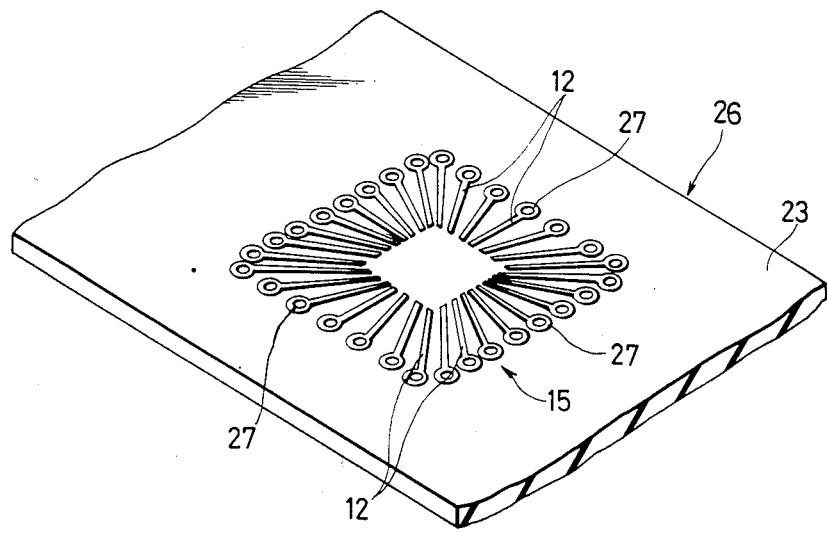
Figure 3E:
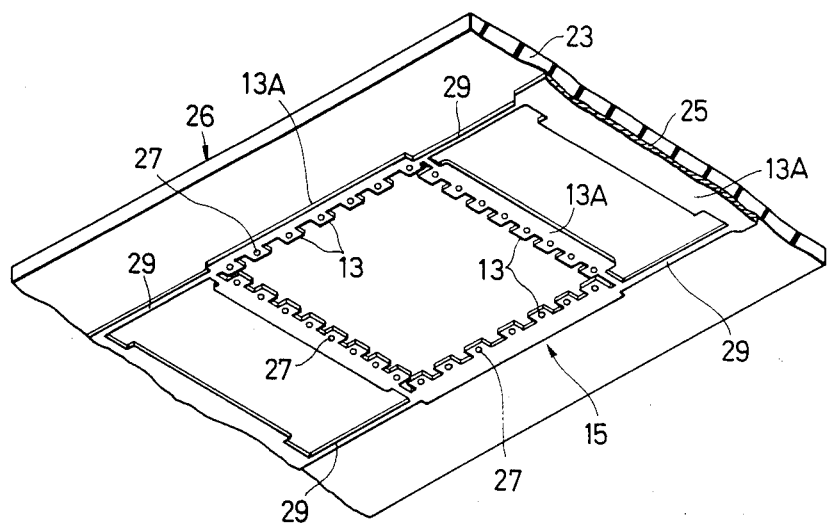

Subsequently, as shown in FIG. 3(B), vertically penetrating through-holes 27 in a number corresponding to the leads 15 are formed in a manner to extend along the outer edge of the package P to be formed and in those positions on the substrate 26 which can be connected with the leads 15 to be formed. As shown in FIG. 3(C), a copper plating layer 28 as the connective portion 14 is formed by performing electroless plating on the inner peripheral surface of each through-hole 27, in such a manner that the respective copper foils 24 and 25 of the upper and lower surfaces are brought into electrical contact through the copper plating layer 28. Thereafter, as shown in FIGS. 3(D) and 3(E), the respective copper foils 24 and 25 on the upper and lower surfaces of the substrate 26 are photoetched by conventional photoetching procedures to form the plurality of inner leads 12 and outer leads 13 which are independent of one another. Needless to say, the photoetching is such that the copper is etched by utilizing a photoresist pattern film which has been formed by the formation of a photo resist film, the exposure of the film through a mask pattern and the developing of the exposed film. In the etching step, using, e.g., conventional copper etching materials which are compatible with the photoresist, as is well-known in the art, the inner leads 12 on the front surface have shapes independent of one another, whereas the outer leads 13 are formed in such a manner that the respective leads are electrically conductive in an area 13A outside the parts extending along what will be the outer edge of the package. In addition, the outer leads of the respective packages are interconnected by connective lines 29. As a result, the respective inner leads 12 are connected to the corresponding outer leads 13 through the copper plating layers 28 in the through-holes 27, and the independent leads 15 are to be constructed of the inner leads 12, the through-holes 27 and the outer leads 13. In this state, however, all the leads 15 are in the conductive state owing to the connective lines 29 as well as the configuration of the outer leads described above.

Figure 3F:
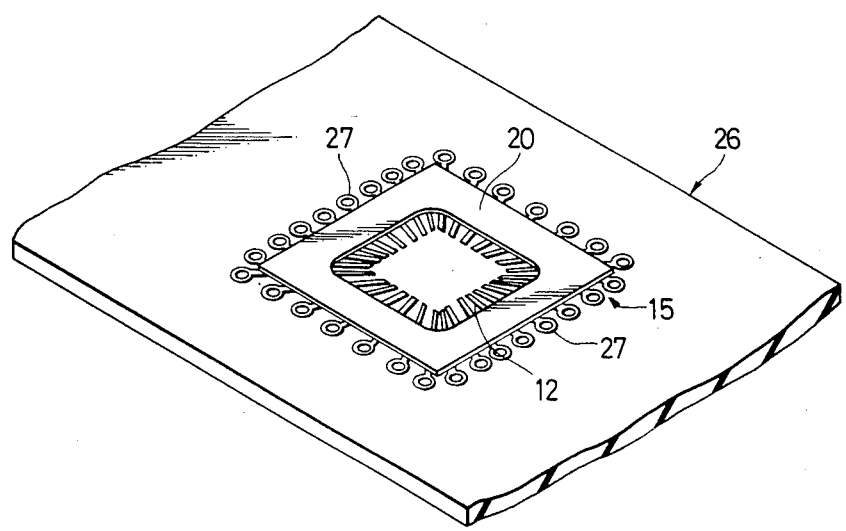

After the leads 15 have been formed as described above, the protective resin 20 is deposited on the intermediate parts of the inner leads 12 on the upper surface of the substrate 26 in the shape of a belt by the screen printing or the like, as illustrated in FIG. 3(F). This protective resin 20 may be applied at need. The parts of the inner leads 12 not coated with the protective resin 20 are subjected to foundation plating with Ni and plating with Au in the next step. These plating operations are electroplating procedures, and the electrical connection of the connective lines 29 and the outer leads 13 permits the plating of all the leads merely by connecting a power supply to a single lead.

Figure 3G:
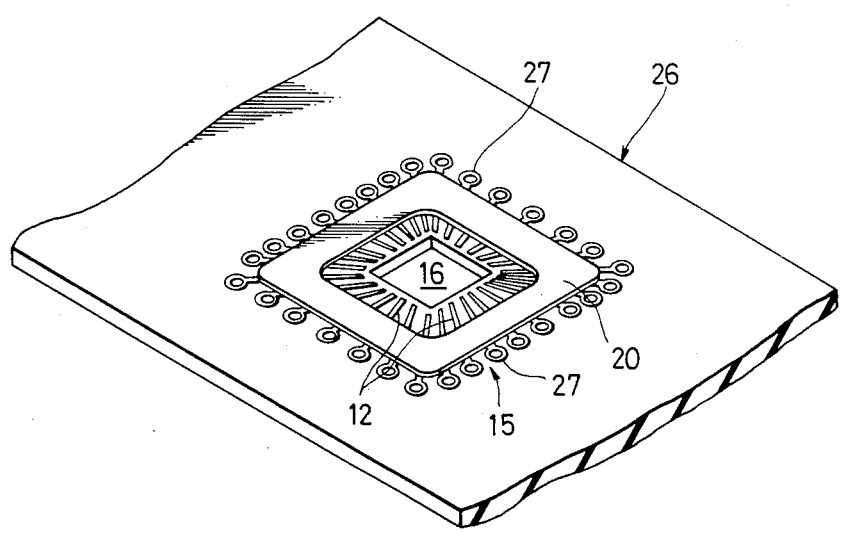
Figure 3H:
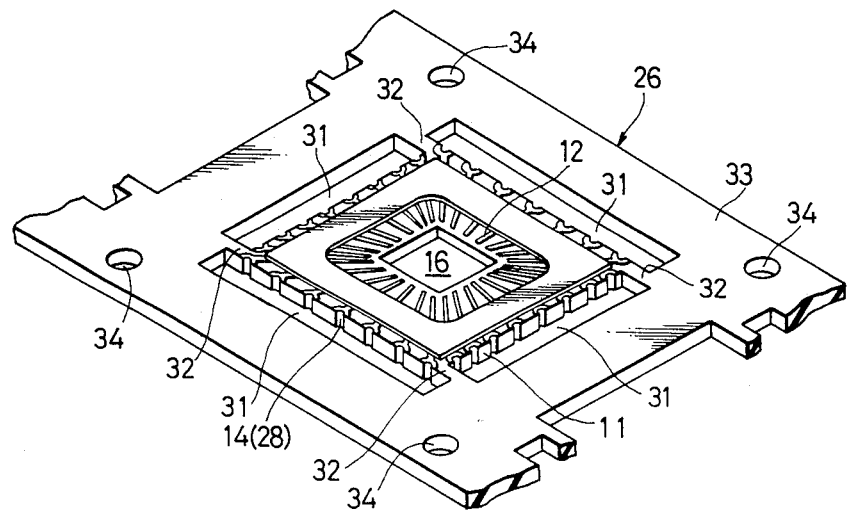
Figure 3I:
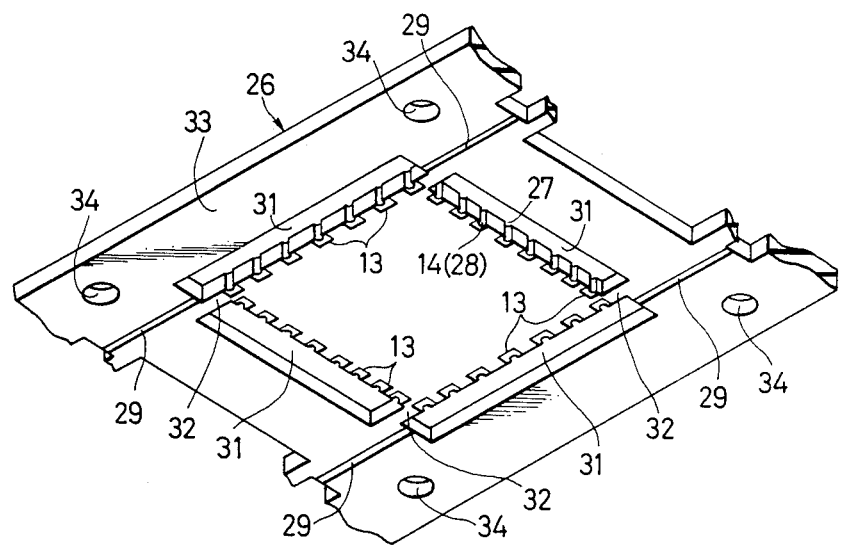

Subsequently, as shown in FIG. 3(G), the recess 16 is formed in such a way that the upper surface of the substrate 26, namely, the central part of the package, is machined for example, by mechanical means, such as utilizing an end mill or bottom fraise, by the spot facing into a square which is somewhat larger than the semiconductor element (pellet). In addition, as shown in FIG. 3(H), slots 31 are formed by punching four sides along the outer edge of the package. The slots 31 establish a state in which the package base 11 to be formed is suspended and supported by an outer peripheral portion (frame portion) 33 through four bridging portions 32 that are formed between the slots 31. Accordingly, the resultant structure is in a state in which the package base 11 can be simply obtained by cutting the bridging portions of small width 32. In addition, since the slots 31 have their inner edges extended along the through-holes 27, the inner parts of the through-holes 27 (gold-plated copper plating layers 28) are exposed as the outer edge of the package base 11 by the slots. Simultaneously therewith, the slots 31 punch the outside area 13A of the outer leads 13. As shown in FIG. 3(I), therefore, the outer leads 13 are respectively separated into individually insulated states, and the connective lines 29 are cut off to render the respective packages on the common substrate 26 not in electrical contact with each other.

Figure 4:
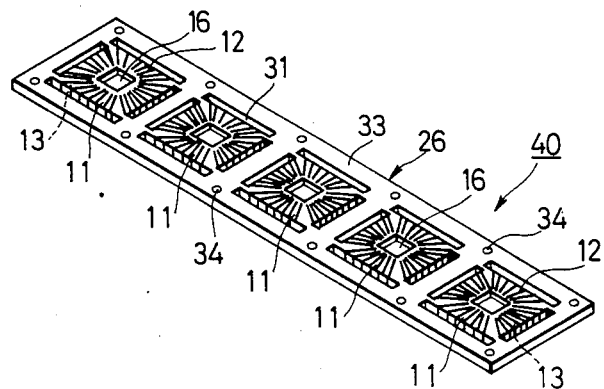

By the above steps, a multiple frame 40 is formed in which, as shown in FIG. 4, the five package bases 11 are formed on the elongate substrate of the glass epoxy plate 26 in multiple fashion. Each base 11 has the recess 16 for fastening the semiconductor element pellet thereon, in the central part of the front surface, the inner leads 12 around the recess, and the outer leads 13, connected to the inner leads 12 through the connective portions, on the rear surface. The inner leads, the connective portions and the outer leads constitute the leads 15. On both sides of the base substrate 26, guide holes 34 are successively provided at suitable pitches (equal to the pitches of the bases). The guide holes 34 can be formed simultaneously with the slots 31. The multiple frame 40 is loaded in an automatic assembly machine, not shown, and the steps of and after mounting the semiconductor elements (pellets) are carried out.

Figure 5:
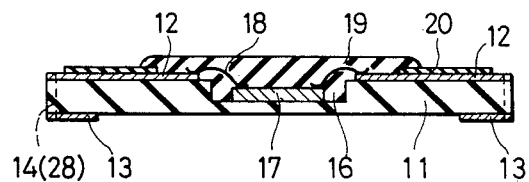

More specifically, as shown in FIG. 5, the semiconductor element (pellet) 17 is fastened on the inner bottom surface of the recess 16 of the package base 11 with a suitable binder, whereupon the inner ends of the respective inner leads 12 and the electrode pads of the pellet 17 are connected by the wires 18. Thereafter, the sealing resin 19 is dropped on the package base 11 by potting or the like so as to seal the pellet 17, wires 18 and inner leads 12. Thus, the assemblage on each package base is completed. Subsequently, when the bridging portions 32 are properly cut, the finished packages separate from the frame portion 33 and are obtained as packages independent of one another.

In the assembling operations, accordingly, the semiconductor elements can be assembled on the base substrate 26 of FIG. 4 by steps and facilities similar to those in the case of forming packages by the use of a multiple lead frame, and the automation of the assemblage can be realized.

In the foregoing process of production, the power supply portions of the respective packages can connect in parallel with one another by common lines in advance and these common lines are left even after the outer leads and connective lines have been cut by the formation of the slots 31. For example, the common lines can be respectively disposed along and outside a pair of connectiive lines 29 as shown in FIG. 3(I). In a modification, the connective lines 29 can be utilized as the common lines by providing electrical connections between connective lines 29 which are separated from each other by the slots 31. In such a case, all the packages can be simultaneously supplied with current merely by energizing some of the common lines after the respective packages have been finished. With such case, ageing operations can be performed with ease and at high efficiency. After completion of the ageing at a temperature, at a voltage and for a period of time as predetermined, the second punching on cutting of the common lines is carried out to construct the respective packages as being electrically independent (even in this case, the respective packages are held mechanically integral through the frame portion 33 by the bridging portions 32), whereby the respective packages can be tested individually and integrally.

After all, since the semiconductor device of the present invention produced as above described uses the single substrate, the thickness of the whole device may be substantially equal to that of the substrate, and this is effective for thinning the device. In addition, since the number of steps is small and no expensive material is used, the device has the effect that it can be produced at low cost. Further, since the base of the device employs a material which is the same as or substantially equivalent to the ordinary printed circuit board, they are substantially equal in the coefficient of thermal expansion, so that the damage of connection attendant upon a temperature change does not occur even in a case where the device has been installed directly on the printed circuit board. Since the package is not of ceramic, it can attain a high dimensional accuracy.

In accordance with the method of producing a semiconductor device according to the present invention, the plurality of packages can be simultaneously formed on the single substrate. Therefore, the production efficiency of the semiconductor devices becomes higher than in the case of the ceramic package. In addition, efficient production is permitted in such a manner that various operations in the process for production are facilitated and that the management of dimensional accuracy, etc. is also facilitated.

While, in the foregoing embodiments, glass epoxy is used as the material of the substrate, there may be utilized other materials such as polyester, polyimide, paper phenol (paper impregnated with phenol resin), glass phenol and triazine. In addition, while the leads are plated with gold in consideration of the solderability thereof as well as the bondability of the wires, plating with Al, Ag or Ni may be performed in some cases.

Figure 6:
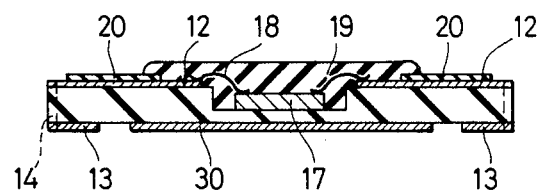
FIG. 6 is a sectional view of a semiconductor device according to another embodiment.

Further, in case of considering heat radiation at the time of an enhanced density of integration or manufacturing a semiconductor device, such as a power IC, in which importance is attached to heat radiation, the semiconductor device is produced as follows. The photoetching processing of the copper foil 25 in the step of FIG. 3(E) is so performed that the copper foil separated from the outer leads 13 is left in a part surrounded with these outer leads on the rear surface of the substrate 26 (in the area to become the base 11), whereby the copper foil to act as a heat sink is formed on the rear surface of the area to become the base 11. Thereafter, processing similar to the foregoing steps of FIGS. 3(F)-3(I) is carried out. Further, processing such as the mounting of the pellet and the potting of the resin is carried out. A sectional view of the semiconductor device produced by such method is shown in FIG. 6. In the figure, numeral 30 indicates the copper foil which serves as the heat sink. Such copper foil can have a thickness in the range of 15–30 μm. Parts indicated by the other numerals are the same as those explained in FIG. 5.

Figure 7:
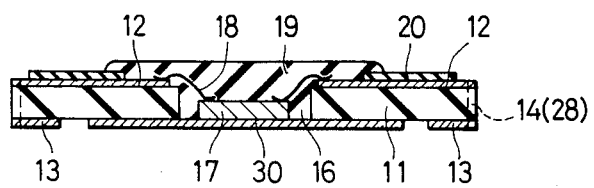
Figure 8:
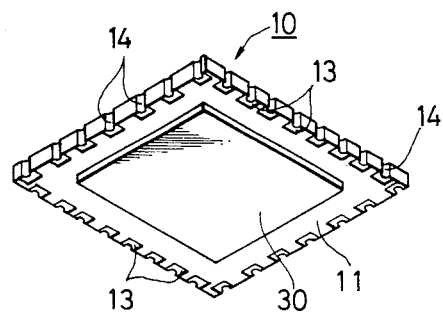
FIG. 8 is a rear perspective view of the semiconductor device shown in FIG. 7.

Alternatively, after the heat sink 30 has been formed as described above, the central part of the package base 11 made, e.g., of the glass epoxy substrate is opened therethrough squarely so as to expose a part of the heat sink 30. For example, the central part of base 11 is opened therethrough by mechanical means using, e.g., an end mill. Alternatively, the substrate can first be formed in such a manner that a copper foil is disposed on only the front surface of a glass epoxy plate, a central portion of the plate is opened therethrough by, e.g., mechanical means, and then a copper foil is disposed at the central portion of the rear surface of the glass epoxy plate. The semiconductor element 17 is fastened on the exposed surface of the heat sink, the element 17 and the inner leads 12 are connected by the wires 18, and the resin 19 which covers the element 17, the wires 18 and parts of the inner leads 12 is applied by the potting method. A section of a semiconductor device formed by such method is shown in FIG. 7, and a rear perspective view is shown in FIG. 8. Referring to the figures, the semiconductor element 17 is connected to the heat sink 30, e.g., by gold-silicon eutectic, or utilizing, e. g., an epoxy resin adhesive, and this semiconductor element 17 and the inner leads 12 are connected by the wires 18. The semiconductor element 17, the wires 18 and the parts of the inner leads 12 are covered with the resin 19. With such method, the semiconductor element is connected directly to the copper foil, so that the heat radiation characteristic is improved more.

When the thickness of the copper foil is insufficient as to the expedient of forming the heat sink, it may be increased by plating or by stacking another copper foil. In addition, the copper foil may be replaced with a copper plate (having a thickness, for example, of about 100 μm).

As set forth above, according to the semiconductor device of the present invention, a base substrate whose material is glass epoxy or the like is formed with leads and is constructed as package bases, pellets are fastened on the bases and are subjected to wire bonding, and the resultant structure is sealed with a resin. Therefore, thinning the semiconductor device and lowering the cost thereof can be achieved, and the installation of the semiconductor device on a printed circuit board usually used is facilitated. On the other hand, there are attained the effects that the dimensional accuracy can be enhanced and that the automation of production can be achieved.

Moreover, according to the producing method of the present invention, the aforementioned semiconductor device can be produced readily and efficiently.

While we have shown and described several embodiments in accordance with the present invention, it is understood that the same is not limited thereto but is susceptible of numerous changes and modifications as known to one having ordinary skill in the art, and we therefore do not wish to be limited to the details shown and described herein, but intend to cover all such modifications as are encompassed by the scope of the appended claims.

What is claimed is:

1. A semiconductor device comprising:
   a base having a front surface, rear surface and side surface, said side surface extending between the front surface and the rear surface, said side surface being nonplanar and having portions which are indented into the base, said front surface being formed in the shape of a square, and said base being made of a material selected from the group consisting of glass epoxy, glass phenol, tirazine, paper phenol, polyimide sand polyester;
   a semiconductor element fastened on said front surface;
   a plurality of inner leads formed on said front surface so as to surround said semiconductor element;
   a plurality of outer leads formed on said rear surface;
   a plurality of connective portions connecting said plurality of inner leads respectively to said plurality of outer leads, said plurality of connective portions being formed on the indented portions of said side surface of said base;
   a plurality of electrical connection parts connecting between said semiconductor element and said plurality of inner leads; and
   a resin sealing, at least, said semiconductor element and said plurality of electrical connection parts.

2. A semiconductor device as defined in claim 1, further comprising a protective resin covering the inner leads in such a manner that the ends thereof to which the electrical connection parts are attached are left exposed.

3. A semiconductor device as defined in claim 1, wherein said semiconductor element is fastened in a recess which is formed in the front surface of said base.

4. A semiconductor device as defined in claim 3, wherein a heat sink is formed on the rear surface of said base.

5. A semiconductor device as defined in claim 4, wherein said heat sink is formed on the rear surface opposite to said recess.

6. A semiconductor device as defined in claim 1, wherein said plurality of electrical connection parts are wires.

7. A semiconductor device as defined in claim 6, wherein the parts of said inner leads contacted by said wires are coated with a coating of gold.

8. A semiconductor device as defined in claim 1, wherein said base is in the form of a plate.

9. A semiconductor device as defined in claim 24, wherein said base is formed of glass fibers filled with an epoxy resin.

10. A semiconductor device as defined in claim 1, wherein said plurality of connective portions are formed by depositing an electrically conductive material on said side surface to electrically connect one of said plurality of inner leads with a respective one of said plurality of outer leads.

11. A multiple frame as defined in claim 10, having a position, surrounded by said inner leads, on each base region for situating a semiconductor element on each base region.

12. A multiple frame as defined in claim 11, wherein said position is a recess formed in the substrate.

13. A semiconductor device as defined in claim 1, wherein said plurality of inner leads, said plurality of outer leads and said plurality of connective portions are not integrally formed.

14. A semiconductor device as defined in claim 1, wherein said base is adapted to be connected to a printed circuit board, and wherein said base has substantially the same coefficient of thermal expansion as that of the printed circuit board.

15. A semiconductor device as defined in claim 1, further comprising a printed circuit board, the base being connected to the printed circuit board, the printed circuit board being comprised of conductive patterns formed on a substrate, and wherein the coefficient of thermal expansion of the base is substantially the same as that of the printed circuit board.

16. A semiconductor device as defined in claim 15, wherein the material of the base is the same as that of the substrate of the printed circuit board.

17. A semiconductor device as defined in claim 15, wherein the base is connected to the printed circuit board by directly connecting said outer leads to corresponding portions of the conductive patterns.

18. A semiconductor device as defined in claim 1, wherein the indented portions extend form the front surface to the rear surface of the base.

19. A semiconductor device comprising:
   a base having a front surface, rear surface and side surface, said side surface extending between the front surface and the rear surface, said side surface being nonplanar and having portions which are indented into the base, said front surface being formed in the shape of square, and said base being made of a material selected from the group consisting of glass epoxy, glass phenol, triazine, paper phenol, polyimide and polyester:
   a hole penetrating through the base between said front surface and rear surface;

a heat sink formed on said rear surface so as to close said hole;

a plurality of inner leads formed on said front surface so as to surround said hole;

a plurality of outer leads formed at said rear surface;

a plurality of connective portions connecting said plurality of inner leasds respectively to said plurality of outer leads, said plurality of connective portions being formed on the indented portions of said side surface of the base;

a semiconductor element fastened on said heat sink in the hole;

a plurality of electrical connection parts connecting between said semiconductor element and said plurality of inner leads; and a resin sealing, at least, said semiconductor element and said plurality of electrical connection parts.

20. A semiconductor device as defined in claim 19, wherein said plurality of electrical connection parts are wires.

21. A semiconductor device as defined in claim 19, wherein said pluraity of outer leads are formed so as to surround said heat sink.

22. A semiconductor device as defined in claim 19, wherein said base is in the form of a plate 23. A semiconductor device as defined in claim 19, wherein said plurality of connective portions are formed by depositing an electrically conductive material on said side surface to electrically connect one of said plurality of inner leads with a respective one of said plurality of outer leads.

24. A semiconductor device as defined in claim 19, wherein said plurality of inner leads, said plurality of outer leads and said plurality of connective portions are not integrally formed.

25. A semiconductor device as defined in claim 19, wherein said base is adapted to be connected to a printed circuit board, and wherein said base has substantially the same coefficient of thermal expansion as that of the printed circuit board.

26. A semiconductor device as defined in claim 19, further comprising a printed circuit board, the base being connected to the printed circuit board, the printed circuit board being comprised of conductive patterns formed on a substrate, and wherein the coefficient of thermal expansion of the base is substantially the same as that of the printed circuit board.

27. A semiconductor device as defined in claim 26, wherein the material of the base is the same as that of the substrate of the printed circuit board.

28. A semiconductor device as defined in claim 26, wherein the base is connected to the printed circuit board by directly connecting said outer leads to corresponding portions of the conductive patterns.

29. A semiconductor device as defined in claim 19 wherein the indented portions extend from the front surface to the rear surface of the base.

30. A multiple frame comprising:

an oblong substrate having a prescribed thickness and adapted to be separated into plural base regions, said oblong substrate being made of a material selected from the group consisting of glass epoxy, glass phenol, triazine, paper phenol, polyimide and polyester;

a plurality of slots extending through said substrate so as to determine respective base regions;

a plurality of inner leads formed on a surface of said respective base regions;

a plurality of outer leads formed at an opposite surface, of said respective base regions, to said surface of the respective base regions on which the plurality of inner leads are formed;

a plurality of connective portions connecting said plurality of inner leads respectively to said plurality of outer leads, said plurality of connective portions being formed on side surfaces of said plural base regions determined by said plurality of slots.

31. A multiple frame as defined in claim 30, wherein said side surfaces of said plural base regions are nonplanar and have portions which are indented into the base regions, and wherein said plurality of connective portions are formed on the indented portions of said side surfaces of said plural base regions.

32. A multiple frame as defined in claim 31, wherein indented portions extend from said surface to said opposite surface of said plural base regions 33. A multiple frame as defined in claim 30, wherein said side surfaces of the plural base regions are determined by said plurality of slots.

* * * * *